United States Patent
Oshio et al.

(10) Patent No.: US 11,073,586 B2
(45) Date of Patent: Jul. 27, 2021

(54) MAGNETIC RESONANCE IMAGING METHOD AND MAGNETIC RESONANCE IMAGING APPARATUS

(71) Applicants: Keio University, Minato-ku (JP); Shinya Yamada, Chiyoda-ku (JP); CANON MEDICAL SYSTEMS CORPORATION, Otawara (JP)

(72) Inventors: Koichi Oshio, Shinjuku-ku (JP); Shinya Yamada, Chiyoda-ku (JP); Masao Yui, Otawara (JP); Seiko Sakuraba, Yokohama (JP)

(73) Assignees: Keio University, Minato-ku (JP); Shinya Yamada, Chiyoda-ku (JP); CANON MEDICAL SYSTEMS CORPORATION, Otawara (JP)

( * ) Notice: Subject to any disclaimer, the term of this patent is extended or adjusted under 35 U.S.C. 154(b) by 68 days.

(21) Appl. No.: 16/699,345

(22) Filed: Nov. 29, 2019

(65) Prior Publication Data
US 2020/0174092 A1    Jun. 4, 2020

(30) Foreign Application Priority Data

Nov. 30, 2018    (JP) .............................. JP2018-225041

(51) Int. Cl.
*G01R 33/561* (2006.01)
*G01R 33/54* (2006.01)

(52) U.S. Cl.
CPC ....... *G01R 33/5614* (2013.01); *G01R 33/543* (2013.01)

(58) Field of Classification Search
USPC ......................................................... 324/309
See application file for complete search history.

(56) References Cited

U.S. PATENT DOCUMENTS

| 8,195,274 | B2 | 6/2012 | Wong | |
| 2004/0162483 | A1 | 8/2004 | Kimura | |
| 2005/0258829 | A1* | 11/2005 | Bieri | G01R 33/5613 324/307 |
| 2008/0009710 | A1 | 1/2008 | Itagaki et al. | |
| 2009/0322331 | A1* | 12/2009 | Buracas | G01R 33/4806 324/309 |
| 2010/0109665 | A1* | 5/2010 | Nielsen | G01R 33/3802 324/309 |
| 2015/0272453 | A1 | 10/2015 | Heberlein et al. | |

FOREIGN PATENT DOCUMENTS

| JP | 63-111845 A | 5/1988 |
| JP | 7-178068 A | 7/1995 |
| JP | 2004-242948 A | 9/2004 |
| JP | 2010-136786 A | 6/2010 |

\* cited by examiner

*Primary Examiner* — Rodney E Fuller
(74) *Attorney, Agent, or Firm* — Oblon, McClelland, Maier & Neustadt, L.L.P.

(57) ABSTRACT

A magnetic resonance imaging method according to an embodiment includes performing a balanced SSFP sequence, repeatedly applies an excitation RF pulse to a subject at intervals of a repetition time and applies gradient magnetic field pulses balanced such that a time integral becomes zero within each interval of the repetition time, while further applying a spin labeling gradient magnetic field for generating one or more continuous spin labels within each interval of the repetition time.

9 Claims, 6 Drawing Sheets

401

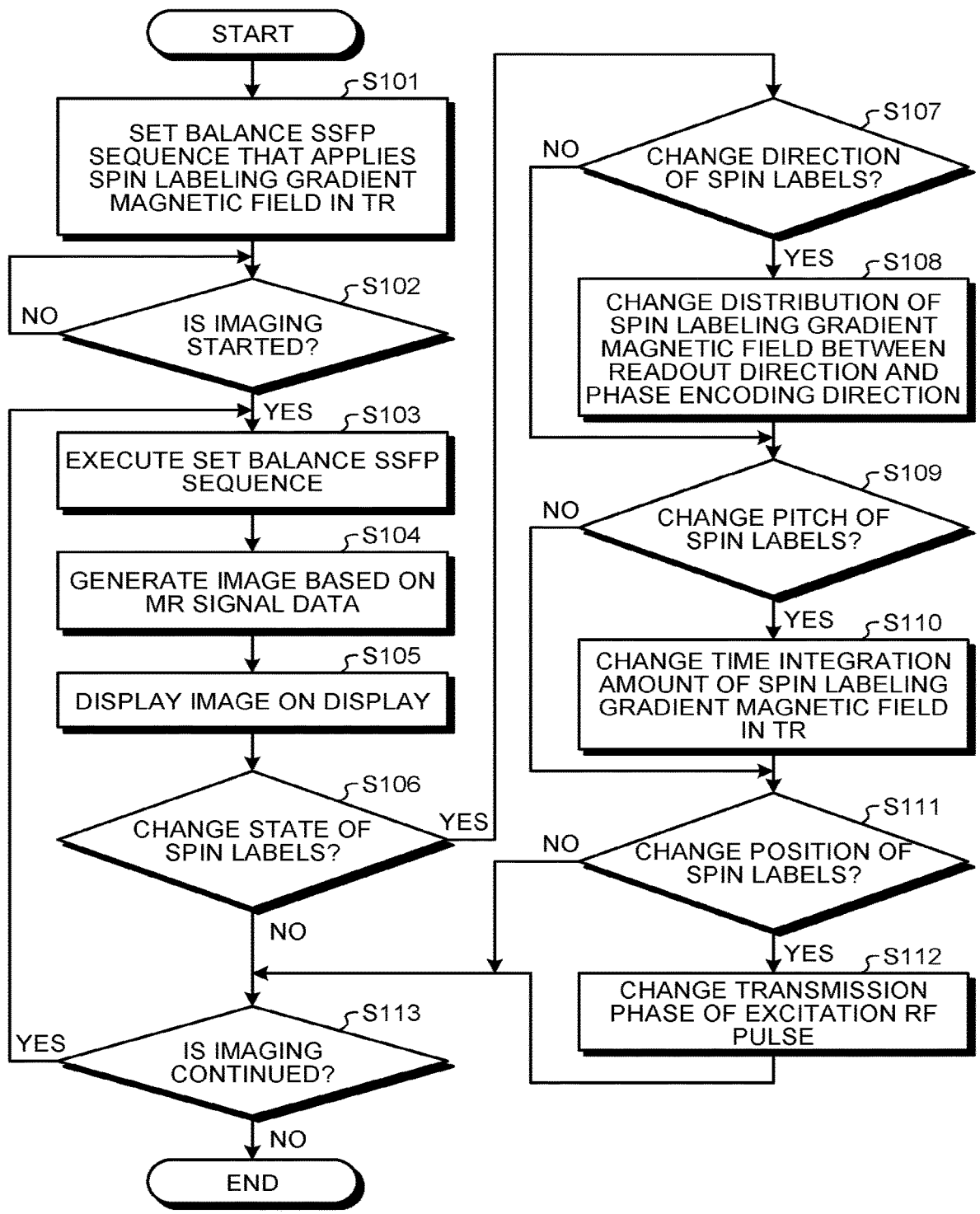

MAGNETIC RESONANCE IMAGING METHOD AND MAGNETIC RESONANCE IMAGING APPARATUS

CROSS-REFERENCE TO RELATED APPLICATIONS

This application is based upon and claims the benefit of priority from Japanese Patent Application No. 2018-225041, filed on Nov. 30, 2018; the entire contents of which are incorporated herein by reference.

FIELD

Embodiments described herein relate generally to a magnetic resonance imaging method and a magnetic resonance imaging apparatus.

BACKGROUND

In the related art, as a method of visualizing the movement of blood, cerebrospinal fluid (CSF), myocardium and the like using a magnetic resonance imaging apparatus, there have been known a time-spatial labeling inversion pulse (Time-SLIP) method and a tagging method. All of these methods perform readout for imaging after labeling an observation target. However, since there is a limitation in a labeling duration, the appearance of the label may not be constant and it may be difficult to appropriately visualize the continuous or involuntary movement of the observation target.

BRIEF DESCRIPTION OF THE DRAWINGS

FIG. 6 is a flowchart illustrating a processing procedure of processing performed by an MRI apparatus according to a first embodiment.

DETAILED DESCRIPTION

A magnetic resonance imaging method according to the present embodiment includes performing a balanced steady-state free precession (bSSFP) sequence, which repeatedly applies an excitation radio frequency (RF) pulse to a subject at intervals of a repetition time and applies gradient magnetic field pulses balanced such that a time integral becomes zero within each interval of the repetition time, while further applying a spin labeling gradient magnetic field for generating one or more continuous spin labels within each interval of the repetition time.

Hereinafter, with reference to the drawings, an embodiment of a magnetic resonance imaging method and a magnetic resonance imaging apparatus according to the present disclosure will be described in detail.

Figure 1:
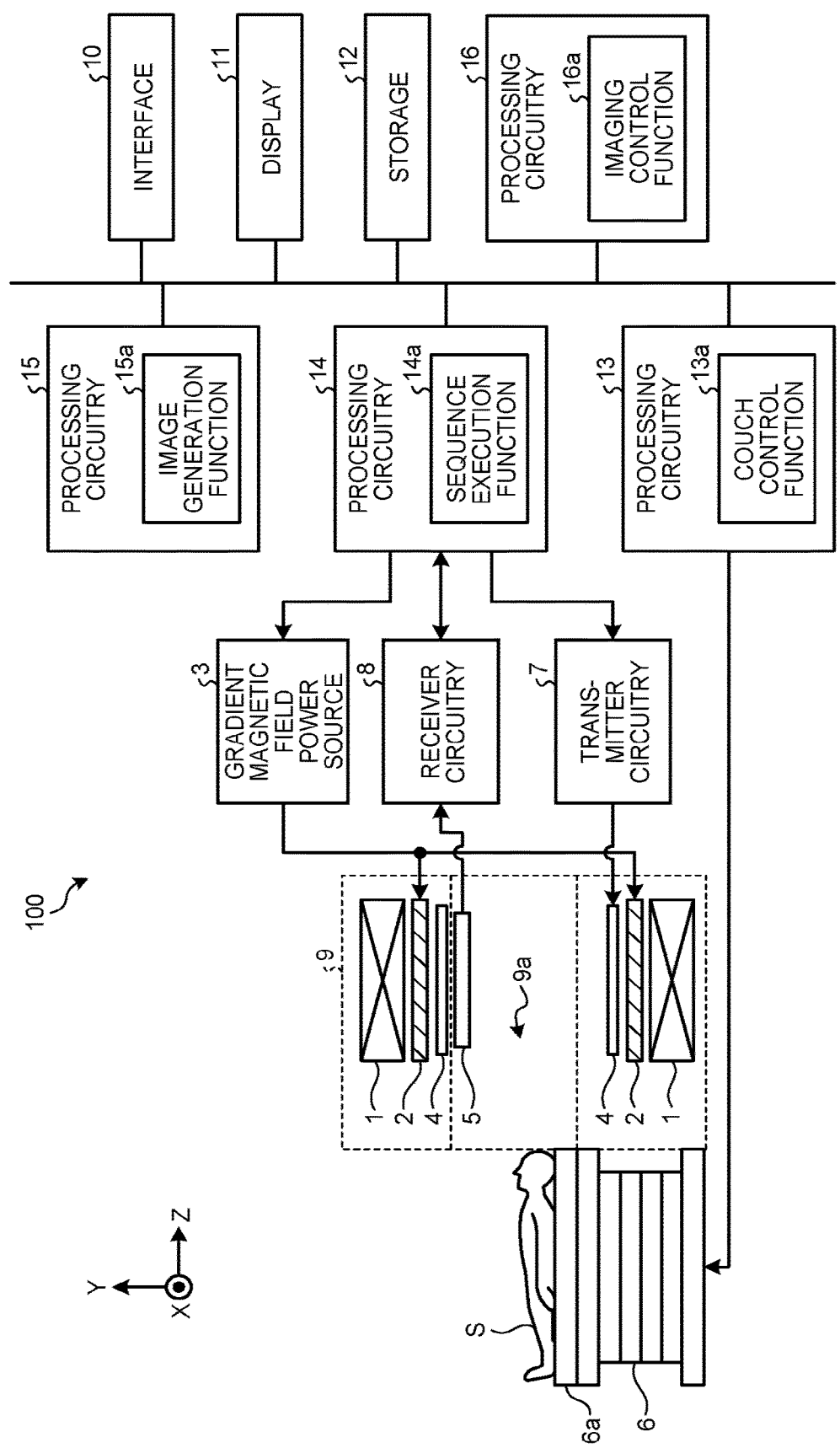
FIG. 1 is a diagram illustrating a configuration example of a magnetic resonance imaging apparatus according to the present embodiment.

FIG. 1 is a diagram illustrating a configuration example of a magnetic resonance imaging (MRI) apparatus according to the present embodiment.

For example, as illustrated in FIG. 1, an MRI apparatus 100 according to the present embodiment includes a static magnetic field magnet 1, a gradient coil 2, a gradient magnetic field power source 3, a whole body coil 4, a local coil 5, a couch 6, transmitter circuitry 7, receiver circuitry 8, a gantry 9, an interface 10, a display 11, a storage 12, and processing circuitries 13 to 16.

The static magnetic field magnet 1 generates a static magnetic field in an imaging space where a subject S is disposed. Specifically, the static magnetic field magnet 1 is formed in a hollow and approximately cylindrical shape (including a shape in which a section orthogonal to a central axis is elliptical) and generates the static magnetic field in the imaging space located on the inner peripheral side thereof. For example, the static magnetic field magnet 1 includes a cooling container formed in an approximately cylindrical shape and a magnet such as a superconducting magnet immersed in a coolant (for example, a liquid helium and the like) filled in the cooling container. The static magnetic field magnet 1 may generate the static magnetic field by using a permanent magnet, for example.

The gradient coil 2 applies gradient magnetic fields to the subject S placed in the static magnetic field generated by the static magnetic field magnet 1. Specifically, the gradient coil 2 is formed in a hollow and approximately cylindrical shape (including a shape in which a section orthogonal to the central axis is elliptical), is disposed on the inner peripheral side of the static magnetic field magnet 1, and generates the gradient magnetic fields in the imaging space on the inner peripheral side thereof, based on a current supplied from the gradient magnetic field power source 3. Furthermore, the gradient coil 2 includes an X coil, a Y coil, and a Z coil corresponding to an X axis, a Y axis, and a Z axis, respectively, and generates the gradient magnetic fields in the imaging space along the axial directions of the X axis, the Y axis, and the Z axis, which are orthogonal to one another, according to the current supplied to each coil from the gradient magnetic field power source 3. In this way, the X axis, the Y axis, and the Z axis constitute an apparatus coordinate system specific to the MRI apparatus 100. For example, the X axis is set along a horizontal direction, the Y axis is set along a vertical direction, and the Z axis coincides with the axial direction of the gradient coil 2 and is set along the magnetic flux of the static magnetic field generated by the static magnetic field magnet 1.

The gradient magnetic field power source 3 supplies the current to each of the X coil, the Y coil, and the Z coil of the gradient coil 2, thereby generates the gradient magnetic fields along the axial directions of the X axis, the Y axis, and the Z axis. Specifically, the gradient magnetic field power source 3 individually supplies the current to the X coil, the Y coil, and the Z coil, thereby generating the gradient magnetic fields whose magnetic field strengths change linearly along a readout direction, a phase encoding direction, and a slice direction orthogonal to one another.

The gradient magnetic field in the readout direction, the gradient magnetic field in the phase encoding direction, and the gradient magnetic field in the slice direction are superimposed on the static magnetic field generated by the static magnetic field magnet 1, so that spatial position information is given to an MR signal generated from the subject S. Specifically, the gradient magnetic field in the readout direction gives position information along the readout direction to the MR signal by changing the frequency of the MR signal according to a position in the readout direction. Furthermore, the gradient magnetic field in the phase encoding direction gives position information along the phase encoding direction to the MR signal by changing the phase of the MR signal according to the phase encoding direction. Furthermore, the gradient magnetic field in the slice direction gives position information along the slice direction to the MR signal. For example, the slice gradient magnetic field is used to determine the direction, thickness and number of slice areas when an imaging area is the slice area and is used to change the phase of the MR signal according to a position in the slice direction when the imaging area is a volume area. In this way, the axis along the readout direction, the axis along the phase encoding direction, and the axis along the slice direction constitute a logical coordinate system for defining the slice area or the volume area to be imaged.

The whole body coil 4 is an RF coil that applies an RF pulse (RF magnetic field) to the subject S and receives an MR signal generated from the subject S due to the influence of the RF pulse. Specifically, the whole body coil 4 is formed in a hollow and approximately cylindrical shape (including a shape in which a section orthogonal to the central axis is elliptical), is disposed on the inner peripheral side of the gradient coil 2, and applies the RF pulse to the subject S disposed in the imaging space on the inner peripheral side thereof, based on an RF pulse signal supplied from the transmitter circuitry 7. Furthermore, the whole body coil 4 receives the MR signal generated from the subject S due to the influence of the RF pulse and outputs the received MR signal to the receiver circuitry 8. For example, the whole body coil 4 is a quadrature (QD) coil.

The local coil 5 is an RF coil that receives the MR signal generated from the subject S. Specifically, the local coil 5 is an RF coil prepared for each part of the subject S and is disposed in the vicinity of the part to be imaged when the subject S is imaged. Furthermore, the local coil 5 receives the MR signal generated from the subject S due to the influence of the RF pulse applied by the whole body coil 4, and outputs the received MR signal to the receiver circuitry 8. The local coil 5 may further have a function of a transmitter coil that applies an RF pulse to the subject S. In such a case, the local coil 5 is connected to the transmitter circuitry 7, and applies the RF pulse to the subject S based on the RF pulse signal supplied from the transmitter circuitry 7. For example, the local coil 5 is a surface coil or an array coil composed of a plurality of surface coils.

The couch 6 includes a couchtop 6a on which the subject S is placed, and when the subject S is imaged, the couchtop 6a with the subject S placed thereon is moved into the imaging space. For example, the couch 6 is installed such that a longitudinal direction of the couchtop 6a is in equilibrium with the central axis of the static magnetic field magnet 1.

The transmitter circuitry 7 outputs the RF pulse signal, which corresponds to the Larmor frequency specific to a target nucleus placed in the static magnetic field, to the whole body coil 4. Specifically, the transmitter circuitry 7 includes a pulse generator, an RF generator, a modulator, and an amplifier. The pulse generator generates a waveform of the RF pulse signal. The RF generator generates an RF signal having a resonance frequency. The modulator generates the RF pulse signal by modulating an amplitude of the RF signal generated by the RF generator with the waveform generated by the pulse generator. The amplifier amplifies the RF pulse signal generated by the modulator and outputs the amplified RF pulse signal to the whole body coil 4.

The receiver circuitry 8 generates MR signal data based on the MR signals received by the whole body coil 4 and the local coil 5, and outputs the generated MR signal data to the processing circuitry 14. Specifically, the receiver circuitry 8 includes a detector, generates, by the detector, the MR signal data by subtracting a resonance frequency component from the MR signals received by the whole body coil 4 and the local coil 5, and outputs the generated MR signal data to the processing circuitry 14.

The gantry 9 includes a hollow bore 9a formed in an approximately cylindrical shape (including a shape in which a section orthogonal to the central axis is elliptical), and supports the static magnetic field magnet 1, the gradient coil 2, and the whole body coil 4. Specifically, the gantry 9 supports the static magnetic field magnet 1, the gradient coil 2, and the whole body coil 4 in the state in which the gradient coil 2 is disposed on the inner peripheral side of the static magnetic field magnet 1, the whole body coil 4 is disposed on the inner peripheral side of the gradient coil 2, and the bore 9a is disposed on the inner peripheral side of the whole body coil 4. A space in the bore 9a of the gantry 9 is the imaging space where the subject S is disposed at the time of imaging.

Here, a description will be provided for an example of the case where the MRI apparatus 100 has what is called a tunnel type configuration in which each of the static magnetic field magnet 1, the gradient coil 2, and the whole body coil 4 is formed in an approximately cylindrical shape; however, the embodiment is not limited thereto. For example, the MRI apparatus 100 may have an open type configuration in which a pair of static magnetic field magnets, a pair of gradient coils, and a pair of RF coils are disposed to face each other while interposing the imaging space, where the subject S is disposed, therebetween. In such a case, the space interposed by the pair of static magnetic field magnets, the pair of gradient coils, and the pair of RF coils corresponds to the bore in the tunnel type configuration.

The interface 10 receives various instructions and input operations of various types of information from an operator. Specifically, the interface 10 is connected to the processing circuitry 16, converts the input operations received from the operator into electrical signals, and outputs the electrical signals to the processing circuitry 16. For example, the interface 10 is implemented by a trackball, a switch button, a mouse, a keyboard, a touch pad for performing an input operation by touching an operation surface, a touch screen in which a display screen and a touch pad are integrally formed with each other, non-contact input circuitry using an optical sensor, voice input circuitry and the like for performing the setting and the like of an imaging condition and a region of interest (ROI). In the present specification, the interface 10 is not limited to one including physical operation parts such as a mouse and a keyboard. For example, an example of the interface 10 also includes electrical signal processing circuitry that receives an electrical signal corresponding to an input operation from an external input device provided separately from the apparatus and outputs the electrical signal to control circuitry.

The display 11 displays various types of information and various images. Specifically, the display 11 is connected to the processing circuitry 16, converts various types of information and various types of image data sent from the processing circuitry 16 into electrical signals for display, and outputs the electrical signals for display. For example, the display 11 is implemented by a liquid crystal monitor, a CRT monitor, a touch panel and the like.

The storage 12 stores various types of data. Specifically, the storage 12 stores MR signal data and image data. For example, the storage 12 is implemented by a semiconductor memory element such as a random access memory (RAM) and a flash memory, a hard disk, an optical disk and the like.

The processing circuitry 13 has a couch control function 13*a*. The couch control function 13*a* controls the operation of the couch 6 by outputting an electrical signal for control to the couch 6. For example, the couch control function 13*a* receives an instruction for moving the couchtop 6*a* in a longitudinal direction, an up and down direction, or a right and left direction from an operator via the interface 10 and operates a movement mechanism of the couchtop 6*a* of the couch 6 so as to move the couchtop 6*a* according to the received instruction.

The processing circuitry 14 has a sequence execution function 14*a*. The sequence execution function 14*a* executes various pulse sequences by controlling the gradient coil 2, the whole body coil 4, and the local coil 5 via the gradient magnetic field power source 3, the transmitter circuitry 7, and the receiver circuitry 8.

Specifically, the sequence execution function 14*a* executes various pulse sequences by driving the gradient magnetic field power source 3, the transmitter circuitry 7, and the receiver circuitry 8 according to sequence execution data output from the processing circuitry 16. The sequence execution data is data representing a pulse sequence and is information that defines a timing at which the gradient magnetic field power source 3 supplies the current to the gradient coil 2 and the intensity of the current that is supplied, a timing at which the transmitter circuitry 7 supplies the RF pulse signal to the whole body coil 4 and the strength of the RF pulse that is supplied, a timing at which the receiver circuitry 8 samples the MR signal, and the like.

Then, the sequence execution function 14*a* collects the MR signal data output from the receiver circuitry 8 as a result of executing various pulse sequences, and stores the collected MR signal data in the storage 12. In such a case, a set of the MR signal data received by the sequence execution function 14*a* is stored in the storage 12 as k space data, which is disposed in a two-dimensional or three-dimensional k space, according to the position information given by the gradient magnetic field in the readout direction, the gradient magnetic field in the phase encoding direction, and the gradient magnetic field in the slice direction described above.

The processing circuitry 15 has an image generation function 15*a*. The image generation function 15*a* generates an image based on the MR signal data stored in the storage 12. Specifically, the image generation function 15*a* reads the MR signal data collected by the sequence execution function 14*a* from the storage 12 and performs a reconstruction process such as Fourier transform on the read MR signal data, thereby generating a two-dimensional or three-dimensional image. Furthermore, the image generation function 15*a* stores the generated image in the storage 12, and reads image data from the storage 12 and output the read image data to the display 11 in response to a request from an operator.

The processing circuitry 16 has an imaging control function 16*a*. The imaging control function 16*a* performs overall control of the MRI apparatus 100 by controlling each constituent element of the MRI apparatus 100. Specifically, the imaging control function 16*a* displays a graphical user interface (GUI) for receiving input operations of various instructions and various types of information from an operator on the display 11, and controls each constituent element of the MRI apparatus 100 according to the input operations received via the interface 10. For example, the imaging control function 16*a* sets various pulse sequences based on imaging conditions input by an operator and transmits sequence execution data representing the set pulse sequences to the processing circuitry 14, thereby executing various pulse sequences.

The aforementioned processing circuitries 13 to 16 are implemented by a processor, for example. In such a case, the processing functions of the processing circuitries are stored in the storage 12 in the form of computer programs executable by a computer, for example. The processing circuitries read the computer programs from the storage 12 and execute the read computer programs, thereby performing functions corresponding to the computer programs. Each processing circuitry may be configured by a plurality of processors and each processor may be configured to perform each processing function by executing the computer program. Furthermore, the processing functions of the processing circuitries may be performed by being appropriately distributed or integrated into single circuitry or a plurality of processing circuitries. In the above, the case where the single storage 12 stores the computer programs corresponding to the processing functions has been described; however, it may be possible to employ a configuration in which a plurality of storage circuitries are disposed in a distributed manner and the processing circuitries read corresponding computer programs from the individual storage circuitries.

So far, the overall configuration of the MRI apparatus 100 according to the present embodiment has been described. Based on such a configuration, the MRI apparatus 100 according to the present embodiment has a function of visualizing the movement of an observation target.

For example, as a method of visualizing the movement of blood, cerebrospinal fluid (CSF), myocardium and the like using a magnetic resonance imaging apparatus, there have been known a time-spatial labeling inversion pulse (Time-SLIP) method and a tagging method. The Time-SLIP method is a method of labeling the blood, the CSF and the like into a slice shape and visualizing the flow and movement of the blood, the CSF and the like into or out of the slice. Furthermore, the tagging method is a method of labeling the myocardium and the like into a lattice shape and visualizing and quantifying the movement of the myocardium and the like.

All of these methods perform readout for imaging after labeling an observation target. However, since there is a limitation in a labeling duration (about 5 seconds to 6 seconds in the Time-SLIP method and about one heartbeat in the tagging method), the appearance of the label may not be constant and it may be difficult to appropriately visualize the continuous or involuntary movement of the observation target.

For this reason, the MRI apparatus 100 according to the present embodiment is configured to be able to more appropriately visualize the continuous or involuntary movement of an observation target. Hereinafter, the configuration of such an MRI apparatus 100 will be described in detail.

First, in the present embodiment, the sequence execution function 14*a* of the processing circuitry 14 performs a balanced steady-state free precession (bSSFP) sequence, which applies gradient magnetic field pulses balanced such that a time integral becomes zero within each repetition time while repeatedly applying an excitation RF pulse to a subject at repetition time intervals, while further applying a spin labeling gradient magnetic field for generating one or more continuous spin labels within each repetition time. The sequence execution function 14a is an example of an execution unit.

The bSSFP sequence (also referred to as a balanced SSFP sequence or a true SSFP) is a pulse sequence in which excitation of nuclear spins is repeated at short repetition time (TR) intervals where transverse relaxation is not sufficiently performed and the time integral of the gradient magnetic field applied within the TR becomes zero, so that MR signals are collected while maintaining longitudinal magnetization and transverse magnetization of a tissue in a steady state.

Figure 2:
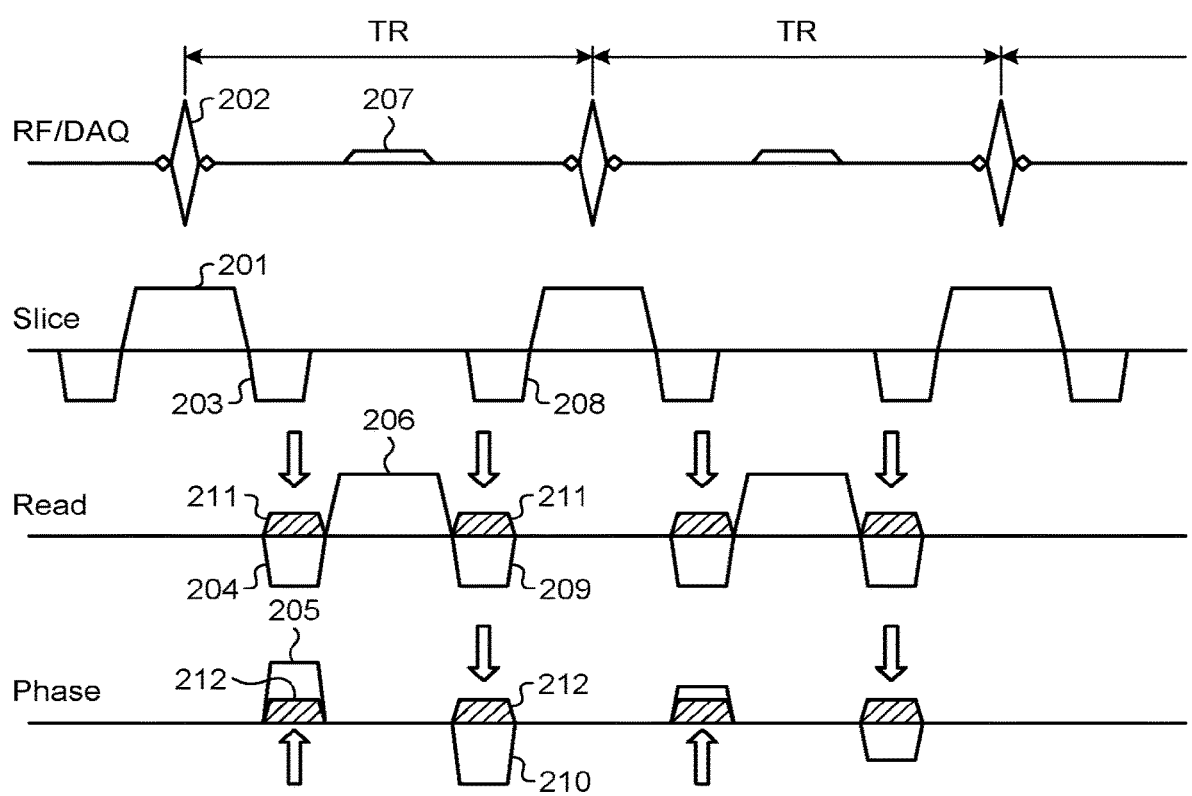
FIG. 2 is a diagram illustrating an example of a pulse sequence performed by a sequence execution function according to the present embodiment.

FIG. 2 is a diagram illustrating an example of a pulse sequence performed by the sequence execution function 14a according to the present embodiment. FIG. 2 illustrates a pulse sequence for collecting a two-dimensional image. Furthermore, in FIG. 2, "RF" indicates an excitation RF pulse, "DAQ" indicates a sampling period of an echo signal, "Slice" indicates an applying timing of a gradient magnetic field in the slice direction, "Read" indicates a gradient magnetic field in the readout direction, and "Phase" indicates a gradient magnetic field in the phase encoding direction.

For example, as illustrated in FIG. 2, in the bSSFP sequence, a slice selection gradient magnetic field pulse 201 and an excitation RF pulse 202 in the slice direction are applied to a subject placed in a static magnetic field at TR intervals set in advance as an imaging condition. Within each TR, after the slice selection gradient magnetic field pulse 201 and the excitation RF pulse 202 are applied, a rephasing gradient magnetic field pulse 203 in the slice direction, a dephasing gradient magnetic field pulse 204 in the readout direction, and a phase encoding gradient magnetic field pulse 205 in the phase encoding direction, of which magnitude is changed for each TR, are applied and then an echo signal is sampled during a sampling period 207 in a state in which a readout magnetic field pulse 206 in the readout direction is applied. Furthermore, after the echo signal is sampled, a rewind gradient magnetic field pulse 208 in the slice direction, a rewind gradient magnetic field pulse 209 in the readout direction, and a rewind gradient magnetic field pulse 210 in the phase encoding direction are applied such that the time integral of the gradient magnetic field applied within the TR is returned to zero.

Furthermore, in the present embodiment, when such a bSSFP sequence is executed, the sequence execution function 14a further applies a spin labeling gradient magnetic field for generating continuous spin labels within each TR along the readout direction and the phase encoding direction.

For example, as indicated by arrows in FIG. 2, the sequence execution function 14a applies a spin labeling gradient magnetic field 211 having a constant magnitude so as to be superimposed on the dephasing gradient magnetic field pulse 204 and the rewind gradient magnetic field pulse 209 in the readout direction within each TR. Furthermore, the sequence execution function 14a applies a spin labeling gradient magnetic field 212 having a constant magnitude so as to be superimposed on the phase encoding gradient magnetic field pulse 205 and the rewind gradient magnetic field pulse 210 in the phase encoding direction. In FIG. 2, for convenience of description, the gradient magnetic field pulses and the spin labeling gradient magnetic fields applied along the readout direction and the phase encoding direction are separately illustrated. However, actually, a magnetic field having a magnitude obtained by adding the gradient magnetic field pulses and the spin labeling gradient magnetic fields is applied.

As described above, in the bSSFP sequence, the spin labeling gradient magnetic field having a constant magnitude is applied as an offset within each TR, so that striped continuous spin labels are generated in an image collected as a result of applying the spin labeling gradient magnetic field.

Specifically, as described above, when the spin labeling gradient magnetic field having a constant magnitude is applied as an offset within each TR, an MR signal is sampled in each TR in a state in which magnetic field inhomogeneity has occurred in the direction in which the spin labeling gradient magnetic field is applied. As a result, a phase shift having a magnitude corresponding to the time integral of the spin labeling gradient magnetic field occurs in the MR signal sampled in each TR. The phase shift is accumulated for each TR, and at a timing at which the magnitude of the phase shift is $\pi$ (180°), signals with opposite phases cancel each other, so that the MR signal becomes no signal. That is, every time the phase shift of the MR signal is $2\pi$, $4\pi$, $6\pi$, ..., $2n\pi$ (n is a natural number), the MR signal becomes no signal once between respective phase shifts. As a consequence, a black striped spin label is generated in the collected image. This is equivalent to a dark band artifact seen in the normal bSSFP sequence, but is used as a spin label through intentional control thereof.

It is noted that the timing of applying the spin labeling gradient magnetic field is not necessarily limited to FIG. 2. For example, the spin labeling gradient magnetic field 211 may be applied over the entire period from the dephasing gradient magnetic field pulse 204 to the rewind gradient magnetic field pulse 209 in the readout direction. Similarly, the spin labeling gradient magnetic field 212 may be applied over the entire period from the phase encoding gradient magnetic field pulse 205 to the rewind gradient magnetic field pulse 210 in the phase encoding direction.

Figure 3:
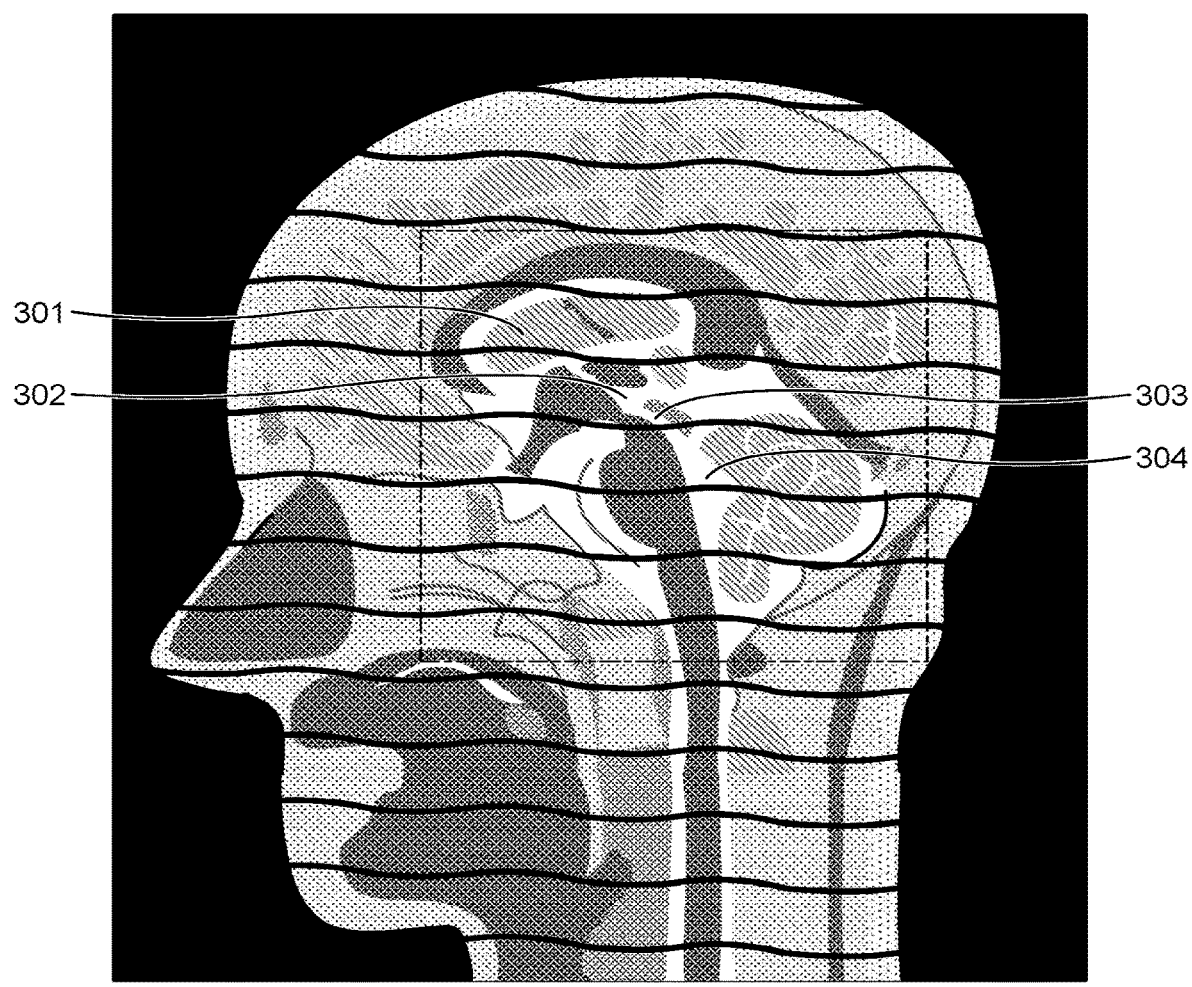
FIG. 3 is a diagram illustrating an example of spin labels generated by a spin labeling gradient magnetic field according to the present embodiment.

FIG. 3 is a diagram illustrating an example of the spin labels generated by the spin labeling gradient magnetic field according to the present embodiment. FIG. 3 illustrates an image obtained by imaging the head of a subject, and a lateral ventricle 301, a third ventricle 302, a cerebral aqueduct 303, a fourth ventricle 304 of the brain of the subject are included in an imaging range.

For example, as illustrated in FIG. 3, the spin labels generated by the spin labeling gradient magnetic field is generated in a stripe shape composed of a plurality of non-intersecting black lines in the image. Here, for example, when the spin labeling gradient magnetic field is applied along the readout direction and the phase encoding direction as illustrated in FIG. 2, striped spin labels are generated in an oblique direction within the surface of the image. The shape of the spin labels should be parallel strips in principle, but actually, the shape of the spin labels is not completely parallel due to the influence of magnetic field inhomogeneity and the like and is a wavy stripe.

Furthermore, in the present embodiment, the image generation function 15a of the processing circuitry 15 generates a plurality of images continuous in time series, based on the MR signal data continuously collected by the sequence execution function 14a. For example, each time data necessary for generating one image is collected, the image generation function 15a generates images based on the data. Furthermore, the image generation function 15a displays the generated images on the display 11 continuously in time series.

As described above, when the images continuous in time series are generated by the image generation function 15a, the shape of the aforementioned striped spin labels is changed depending on the movement of fluid and organ included in each image.

Figure 4A:
FIGS. 4A to 4C are diagrams illustrating an example of a change in spin labels generated by a spin labeling gradient magnetic field according to the present embodiment.
Figure 4B:
Figure 4C:

FIGS. 4A to 4C are diagrams illustrating an example of a change in the spin labels generated by the spin labeling gradient magnetic field according to the present embodiment. FIGS. 4A to 4C illustrate the change in the spin labels in a range indicated by a one dot chain line in the image illustrated in FIG. 3.

For example, when CSF flows from the fourth ventricle 304 to the third ventricle 302 through the cerebral aqueduct 303 in the brain of the subject during imaging, parts generated on the third ventricle 302, the cerebral aqueduct 303, and the fourth ventricle 304 in the spin labels are deformed so as to protrude in the flow direction of the CSF in the brain images continuous in time series, as illustrated in FIGS. 4A and 4B.

In such a case, for example, when the flow of the CSF is steady flow slower than a certain speed, the protruding portions of the spin labels are fixed and displayed in a shifted state. Furthermore, for example, when the flow of the CSF becomes suddenly faster, the protruding portions of the spin labels may be separated from other portions and displayed so as to jump out in the flow direction of the CSF.

Figure 5A:
FIGS. 5A and 5B are diagrams illustrating another example of a change in spin labels generated by a spin labeling gradient magnetic field according to the present embodiment.
Figure 5B:
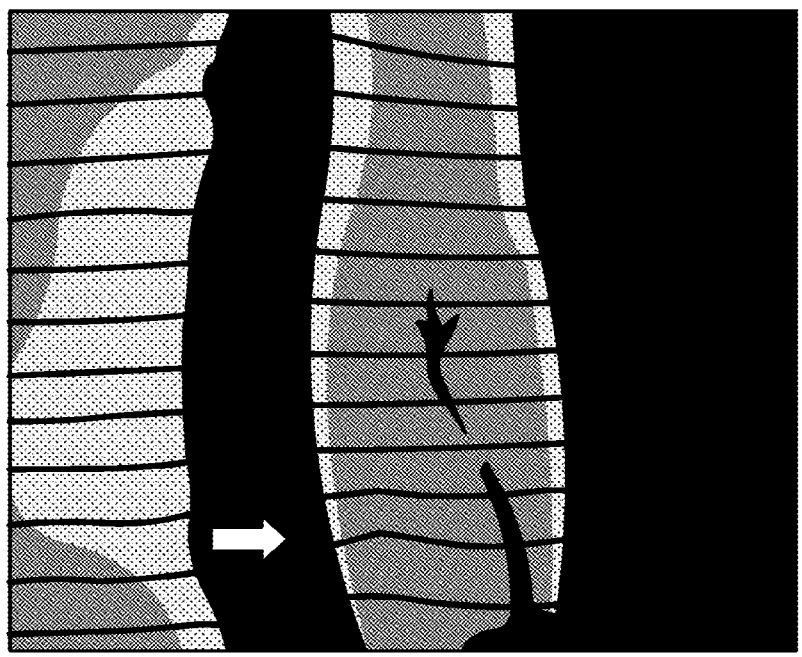

FIGS. 5A and 5B are diagrams illustrating another example of a change in the spin labels generated by the spin labeling gradient magnetic field according to the present embodiment. FIGS. 5A and 5B illustrate images obtained by imaging the arm of a subject, and the front arm of the subject are included in an imaging range.

For example, when a skeletal muscle 401 that moves a finger included in the front arm of the subject contracts during imaging, portions generated on the skeletal muscle 401 in the spin labels are deformed so as to protrude in the contraction direction of the skeletal muscle 401 with the movement of the finger in the images of the front arm continuous in time series as illustrated in FIGS. 5A and 5B (see a point indicated by an arrow in FIG. 5B.

As described above, in the present embodiment, it is possible to visualize the movement of the CSF and the skeletal muscle by the aforementioned striped spin labels. In this way, an operator can grasp the movement of fluid and organ to be observed from the state of the movement of the striped spin labels. Since the aforementioned spin labels do not disappear over time, the operator can continuously observe the observation target. Furthermore, according to the aforementioned spin labels, it is possible to continuously visualize the movement, synchrony, and synchronism of different positions in the surface of an image.

In the above, although the example of the CSF and the skeletal muscle has been described, an application example of the aforementioned spin labels is not limited thereto.

For example, the aforementioned spin labels can also be similarly applied to a case of visualizing the flow of other liquids such as water, blood, urine, bile, pancreatic juice, lymph fluid, inner ear lymph fluid, saliva, and aqueous humor. For example, as an example of application to water, it is possible to grasp the flow of the water in edema and specify inflow and outflow points. Furthermore, for example, as an example of application to blood, it is possible to grasp a true lumen and a false lumen of aortic dissection and grasp dissection points. Furthermore, for example, as an example of application to urine, it is possible to grasp the movement of the urine in kidney, urinary tract, or bladder. Furthermore, for example, it is possible to grasp the distribution of bile and pancreatic juice. Furthermore, for example, it is possible to grasp the movement of liquid that occurs in pathological conditions such as ascites and pleural effusion fluid.

Furthermore, for example, the aforementioned spin labels can also be similarly applied to a case of visualizing the movement of other organs such as muscles and organs other than the front arm, brain parenchyma, intestines, and eyeballs. For example, when the eyeball is an observation target, it is possible to perform movement detection and quantification of a movement angle and the like, inclusive of involuntary movement of the eyeball.

Furthermore, in the present embodiment, the imaging control function 16a of the processing circuitry 16 further changes the state of the spin labels generated in the stripe shape by changing at least one of the spin labeling gradient magnetic field and the excitation RF pulse.

Specifically, the imaging control function 16a controls the direction of the spin labels by changing the distribution of the spin labeling gradient magnetic field between the readout direction and the phase encoding direction.

For example, in the two-dimensional images as illustrated in FIG. 3 to FIG. 5B, it is assumed that the right and left direction corresponds to the readout direction and the up and down direction corresponds to the phase encoding direction. In such a case, for example, as illustrated in FIG. 2, when the spin labeling gradient magnetic field is applied along the readout direction and the phase encoding direction, striped spin labels are generated in a direction oblique to the up and down direction and the right and left direction within the surface of the image.

Here, for example, when the imaging control function 16a sets the distribution of the spin labeling gradient magnetic field in the readout direction to be larger than the spin labeling gradient magnetic field in the phase encoding direction, a striped dark band is generated so as to be more parallel to the phase encoding direction, that is, the direction of the spin labels is inclined at an angle close to the up and down direction. Furthermore, for example, when the imaging control function 16a sets the distribution of the spin labeling gradient magnetic field in the phase encoding direction to zero and sets the distribution of the spin labeling gradient magnetic field in the readout direction to other than zero, the striped dark band is generated so as to be parallel to the phase encoding direction, that is, the direction of the spin labels becomes the up and down direction.

On the other hand, when the imaging control function 16a sets the distribution of the spin labeling gradient magnetic field in the phase encoding direction to be larger than the spin labeling gradient magnetic field in the readout direction, the direction of the spin labels is inclined at an angle close to the right and left direction. Furthermore, for example, when the imaging control function 16a sets the distribution of the spin labeling gradient magnetic field in the readout direction to zero and sets the distribution of the spin labeling gradient magnetic field in the phase encoding direction to other than zero, the direction of the spin labels becomes the right and left direction.

Furthermore, the imaging control function 16a controls the pitch of the spin labels by changing the time integral of the spin labeling gradient magnetic field in the TR. For example, the imaging control function 16a increases the time integral of the spin labeling gradient magnetic field in the TR, thereby making the pitch of the spin labels finer (narrowing an interval). Furthermore, for example, the imaging control function 16a decreases the time integral of the spin labeling gradient magnetic field in the TR, thereby making the pitch of the spin labels coarse (widening an interval).

Furthermore, the imaging control function 16a controls the position of the spin labels by changing the transmission phase of the excitation RF pulse. For example, the imaging control function 16a translates the spin labels by incrementing the transmission phase of continuous excitation RF pulses by a certain amount (phase cycling).

FIG. 6 is a flowchart illustrating a processing procedure of processing performed by the MRI apparatus 100 according to a first embodiment.

For example, as illustrated in FIG. 6, in the present embodiment, the imaging control function 16a sets the bSSFP sequence that applies the spin labeling gradient magnetic field within the TR (step S101), and when an instruction to start imaging is received from an operator (Yes at step S102), the imaging control function 16a starts the imaging by transmitting sequence execution data representing the set bSSFP sequence to the processing circuitry 14.

Subsequently, the sequence execution function 14a executes the bSSFP sequence set by the imaging control function 16a, based on the received sequence execution data (step S103). Then, the image generation function 15a generates an image based on MR signal data collected by the bSSFP sequence (step S104) and displays the generated image on the display 11 (step S105).

When an instruction to change the state of spin labels is received from the operator (Yes at step S106), the imaging control function 16a changes at least one of the spin labeling gradient magnetic field and the excitation RF pulse according to the received instruction.

Specifically, when an instruction to change the direction of the spin labels is received (Yes at step S107), the imaging control function 16a changes the distribution of the spin labeling gradient magnetic field between the readout direction and the phase encoding direction according to the received instruction (step S108).

Furthermore, when an instruction to change the pitch of the spin labels is received (Yes at step S109), the imaging control function 16a changes the time integral of the spin labeling gradient magnetic field in the TR according to the received instruction (step S110).

Furthermore, when an instruction to change the position of the spin labels is received (Yes at step S111), the imaging control function 16a changes the transmission phase of the excitation RF pulse according to the received instruction (step S112).

Thereafter, when an instruction to continue the imaging is received from the operator (Yes at step S113), the imaging control function 16a continues the imaging under the condition of the changed spin labels (returns to step S103). On the other hand, when an instruction not to continue (end) the imaging is received from the operator (No at step S113), the imaging control function 16a ends the imaging.

The processing of steps S101, S102, and S106 to S113 described above, for example, is performed when the processing circuitry 16 reads a predetermined computer program corresponding to the imaging control function 16a from the storage 12 and executes the read computer program. Furthermore, the processing of step S103, for example, is performed when the processing circuitry 14 reads a predetermined computer program corresponding to the sequence execution function 14a from the storage 12 and executes the read computer program. Furthermore, the processing of steps S104 and S105, for example, is performed when the processing circuitry 15 reads a predetermined computer program corresponding to the image generation function 15a from the storage 12 and executes the read computer program.

As described above, in the present embodiment, the imaging control function 16a can change the spin labels during the continuous image collection.

In the above, although the example in which the imaging control function 16a changes a label between imaging of one image and imaging of the next image has been described, the embodiment is not limited thereto. For example, the imaging control function 16a may change the label between data collection of one TR and data collection of the next TR. Furthermore, the imaging control function 16a may insert and execute a sequence for interrupting or starting the bSSFP sequence before and after the timing of changing the label. The sequence for interrupting or starting described herein, for example, includes a sequence for applying an RF pulse for flip back, a sequence for applying an RF pulse for startup, and the like.

Furthermore, in the above, although the example in which the imaging control function 16a changes the state of the spin labels based on the instruction from the operator has been described, the embodiment is not limited thereto. For example, the imaging control function 16a may detect a periodical state change (movement) of a subject by analyzing a biological signal acquired from the subject or an image collected continuously in time series, and change the state of the spin labels based on the detected state change (movement). For example, the imaging control function 16a detects the periodical state change (movement) of the subject by using an electrocardiogram signal indicating a heartbeat cycle, a pulse wave signal indicating a pulse cycle, a respiratory signal indicating a respiratory cycle, and the like as input signals. Furthermore, for example, the imaging control function 16a compares images continuously collected to detect a change between the images, and detects the periodical state change (movement) of the subject based on the detected change. For example, by changing the state of the spin labels based on the respiratory cycle of the subject, it is possible to continuously observe a change in finger movement when normal breathing is switched to forced deep breathing. As a representative example of changing the state of the spin labels, the increment amount of the transmission phase of the excitation RF pulse is periodically changed or the time integral of the spin labeling gradient magnetic field in the TR is periodically changed.

As described above, according to the present embodiment, by executing the bSSFP sequence while further applying the spin labeling gradient magnetic field for generating the spin labels within each repetition time, it is possible to simultaneously and continuously generate the striped spin labels and to continuously collect labeled images. In this way, it is possible to obtain an effect such as simultaneous visualization of movement at different positions in the surface of the image. Consequently, according to the present embodiment, it is possible to more appropriately visualize the continuous or involuntary movement of an observation target.

In the aforementioned embodiment, although the example in which the two-dimensional image is collected has been described, the embodiment is not limited thereto. For example, a labeling method using the aforementioned spin labeling gradient magnetic field can also be similarly applied to a case where a three-dimensional image (volume data) is collected with the bSSFP sequence.

Furthermore, in the aforementioned embodiment, although the example in which the execution unit in the present specification is implemented by the execution function of the processing circuitry has been described, the embodiment is not limited thereto. For example, the execution unit in the present specification may be implemented by the execution function described in the embodiment, and the same function may be implemented by hardware alone or a combination of hardware and software.

The term "processor" used in the above description, for example, means circuitry such as a central processing unit (CPU), a graphics processing unit (GPU), an application specific integrated circuit (ASIC), a programmable logic device (for example, a simple programmable logic device (SPLD)), a complex programmable logic device (CPLD), and a field programmable gate array (FPGA). The processor performs functions by reading and executing the computer programs stored in the storage. Instead of storing the computer programs in the storage, the computer programs may be directly incorporated in the circuitry of the processor. In such a case, the processor performs the functions by reading and executing the computer programs incorporated in the circuitry. Each processor of the present embodiment is not limited to being configured as single circuitry; however, one processor may be configured by combining a plurality of independent circuitries to perform functions thereof.

The computer program executed by the processor is provided by being incorporated in advance in a read only memory (ROM), a storage and the like. This computer program may be provided by being recorded on a computer readable recording medium, such as a CD (compact disc)-ROM, a flexible disk (FD), a CD-R (recordable), and a digital versatile disc (DVD), in a file format installable or executable in these devices. Furthermore, this computer program may be provided or distributed by being stored on a computer connected to a network such as the Internet and downloaded via the network. For example, this computer program is configured as a module including the aforementioned each functional unit. As actual hardware, a CPU reads the computer program from a storage medium such as a ROM and executes the read computer program, so that each module is loaded on a main storage device and generated on the main storage device.

According to at least one embodiment described above, it is possible to more appropriately visualize the continuous or involuntary movement of an observation target.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging method comprising:
    performing a balanced steady-state free precession (bSSFP) sequence, which repeatedly applies an excitation radio frequency (RF) pulse to a subject at intervals of a repetition time and applies gradient magnetic field pulses balanced such that a time integral becomes zero within each interval of the repetition time, while further applying a spin labeling gradient magnetic field for generating one or more continuous spin labels within each interval of the repetition time.

2. The magnetic resonance imaging method according to claim 1, wherein the one or more continuous spin labels are generated in a stripe shape in an image collected by the bSSFP sequence.

3. The magnetic resonance imaging method according to claim 2, further comprising:
    changing a state of the one or more spin labels by changing at least one of the spin labeling gradient magnetic field and the excitation RF pulse.

4. The magnetic resonance imaging method according to claim 3, wherein the spin labeling gradient magnetic field is applied along a readout direction and a phase encoding direction, and a distribution of the spin labeling gradient magnetic field between the readout direction and the phase encoding direction is changed, so that the one or more spin labels are aligned parallel to a predetermined direction.

5. The magnetic resonance imaging method according to claim 3, wherein a time integral of the spin labeling gradient magnetic field is changed, so that the one or more spin labels are generated with a predetermined pitch.

6. The magnetic resonance imaging method according to claim 3, wherein a transmission phase of the excitation RF pulse is changed, so that the one or more spin labels are generated at predetermined position.

7. The magnetic resonance imaging method according to claim 3, wherein the state of the one or more spin labels is changed based on an instruction from an operator.

8. The magnetic resonance imaging method according to claim 3, wherein a periodical state change of the subject is detected by analyzing a biological signal acquired from the subject or an image collected continuously in time series, and the state of the one or more spin labels is changed based on the detected state change.

9. A magnetic resonance imaging apparatus comprising:
    a gradient coil configured to apply a gradient magnetic field to a subject placed in a static magnetic field;
    an RF coli configured to apply an RF pulse to the subject; and
    processing circuitry configured to perform a balanced steady-state free precession (bSSFP) sequence, which repeatedly applies an excitation radio frequency (RF) pulse to a subject at intervals of a repetition time and applies gradient magnetic field pulses balanced such that a time integral becomes zero within each interval of the repetition time, by controlling the gradient coil and the RF coli, wherein
    the processing circuitry performs the bSSFP sequence while further applying a spin labeling gradient magnetic field for generating one or more continuous spin labels within each interval of the repetition time.

* * * * *